United States Patent
Yang

(10) Patent No.: US 7,122,443 B2
(45) Date of Patent: Oct. 17, 2006

(54) METHOD OF FABRICATING FLASH MEMORY DEVICE

(75) Inventor: In Kwon Yang, Kyungki-Do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/015,451

(22) Filed: Dec. 17, 2004

(65) Prior Publication Data

US 2006/0088965 A1    Apr. 27, 2006

(30) Foreign Application Priority Data

Oct. 25, 2004    (KR) .................. 10-2004-0085430

(51) Int. Cl.
*H01L 21/76*    (2006.01)
(52) U.S. Cl. ................... 438/437; 438/430; 438/427
(58) Field of Classification Search ............. 438/424, 438/243, 430, 437, 435, 434, 427, 425, 428, 438/429

See application file for complete search history.

(56) References Cited

U.S. PATENT DOCUMENTS

| 6,258,692 B1 * | 7/2001 | Chu et al. ............... 438/437 |
| 6,794,269 B1 * | 9/2004 | Gopalan et al. ......... 438/427 |
| 6,805,614 B1 * | 10/2004 | Kwok .................... 451/41 |

\* cited by examiner

*Primary Examiner*—Walter L. Lindsay, Jr.

(74) *Attorney, Agent, or Firm*—Marshall, Gerstein & Borun LLP

(57) ABSTRACT

A method of fabricating a flash memory device is disclosed where a trench formation process and a wall oxide film formation process are performed separately depending on a pattern density, and wall oxide films are formed with different thicknesses. Accordingly, an increase in a thickness of the wall oxide films due to a smiling effect of tunnel oxide films by a wall oxidization process is prevented and reliability of a device can thus be improved.

6 Claims, 3 Drawing Sheets

METHOD OF FABRICATING FLASH MEMORY DEVICE

BACKGROUND

1. Technical Field

A method of fabricating a NAND type flash memory device is disclosed in which an increase in a thickness of wall oxide films due to a "smiling" effect of the tunnel oxide films formed by a wall oxidization process is prevented. To prevent the wall oxide film thickness increase, a trench formation process and a wall oxide film formation process are performed separately depending on the pattern density, and the wall oxide films are formed with different thicknesses.

2. Description of the Related Art

The most important factor to be considered in the process of forming an isolation film in a NAND-type flash memory device of below 0.07 µm may include film quality of the tunnel oxide film against a floating gate and an alignment method. For this purpose, according to the prior art, an underlying gate profile is first secured using a polysilicon film and an element isolation process is then performed to secure the film quality of the tunnel oxide film. An isolation film and a floating gate are formed in a self-aligned manner.

This method of fabricating the flash memory device will be briefly described below. A tunnel oxide film, a polysilicon film and a hard mask film are sequentially formed on a semiconductor substrate. The hard mask film is patterned using a photolithography process using an isolation mask and an etch process. Next, the polysilicon film and the tunnel oxide film are etched using the patterned hard mask film as a mask and the semiconductor substrate is then etched to a given depth, thus forming a trench. After a wall oxide film and a liner oxide film are formed in the trench, the trench is filled with an oxide film, thus forming an isolation film. Thereafter, after the hard mask film is removed, a polysilicon film is formed and is then patterned, thereby forming a floating gate.

In the aforementioned process, the trench formation process and the wall oxide film formation process are performed in a cell region and a peripheral circuit region at the same time regardless of the pattern density. Furthermore, the wall oxidization process is one of processes which has to be performed appropriately and sufficiently in order to improve ISB fail and hump characteristics as well as remove the leakage current by surface damage of the semiconductor substrate in a dry etch for forming the trench.

Accordingly, the wall oxide film must be formed in a sufficient thickness on the basis of a region where the pattern density is low. If the wall oxide film is formed on the basis of the region where the pattern density is low, more particularly, the peripheral circuit region having a high gate size, however, a side "smiling" effect of the tunnel oxide film is generated by the wall oxidization process in the region where the pattern density is dense, or more particularly, the cell region where the size of the gate become small. Therefore, there are problems in that a thickness of the tunnel oxide film increases and the film quality of the tunnel oxide film is degraded.

This situation becomes more severe during an annealing process and a re-oxidization process after a dielectric film is formed by a subsequent process. Increases in the thickness of the tunnel oxide film can cause a failure in the read and write operations which are the most basic device operations of a NAND-type flash memory device.

An increase in the thickness of the tunnel oxide film by the thermal process has a greater influence on the device when the size of the gate is smaller. Furthermore, if the size of the floating gate is smaller than that of the active region, the thickness of the tunnel oxide film is further increased as a tunneling effect is combined with the smiling effect.

SUMMARY OF THE DISCLOSURE

Accordingly, a method of fabricating a flash memory device is disclosed in which an increase in a thickness of a tunnel oxide film by a wall oxidization process can be prevented thereby improving reliability of the device.

A method of fabricating a flash memory device, in which increase in a thickness of a tunnel oxide film by a wall oxidization process can be prevented thereby improving reliability of the device, are performed in such a way that a trench formation process and a wall oxide film formation process are performed separately, depending on the pattern density, and wall oxide films are formed with different thicknesses.

To achieve the above objects, according to an embodiment of the invention, there is provided a method of fabricating a flash memory device, including the steps of sequentially forming a tunnel oxide film, a polysilicon film and a hard mask film on a semiconductor substrate in which a first region and a second region are defined horizontally, etching a predetermined region of the hard mask film, the polysilicon film and the tunnel oxide film in the second region; then etching the semiconductor substrate to a given depth to form a first trench; forming a first wall oxide film on the first trench; forming a first insulating film on the entire surface so that the first trench is buried or filled; etching a predetermined region of the hard mask film, the polysilicon film and the tunnel oxide film in the first region; etching the semiconductor substrate to a given depth to form a second trench; forming a second wall oxide film on the second trench; forming a second insulating film on the entire surface so that the second trench is buried; polishing the first and second insulating films; and then removing the hard mask film.

In an embodiment, the first region is a region where the pattern density is higher, and the second region is a region where the pattern density is lower.

In an embodiment, the first region is a cell region and the second region is a peripheral circuit region.

In an embodiment, the first region is a region where the gate size is small, and the second region is a region where the gate size is large.

In an embodiment, the first wall oxide film is formed thicker than the second wall oxide film.

In an embodiment, the first wall oxide film is formed 30 to 60 Å and the second wall oxide film is formed with a thickness of 10 to 30 Å.

In an embodiment, the first and second wall oxide films are formed by a dry oxidization process at a temperature ranging from 750 to 850° C.

In an embodiment, the first and second insulating films include a HDP oxide film.

According to another embodiment, there is provided a method of fabricating a flash memory device in which a plurality of trenches are formed horizontally on a semiconductor substrate, a plurality of wall oxide films are formed in the trenches, and the trenches are buried with an insulating film, wherein the trenches are formed by a different process depending on the pattern density, and the wall oxide films are formed by a different process depending on the pattern density to form in a different thickness.

In an embodiment, the wall oxide films are formed thicker in a region where the pattern density is lower than in a region where the pattern density higher.

DETAILED DESCRIPTION OF THE PRESENTLY PREFERRED EMBODIMENTS

Now, preferred embodiments will be described with reference to the accompanying drawings.

FIGS. 1A to 1F are sectional views sequentially showing process steps for embodying a method of fabricating a flash memory device according to the present invention.

Figure 1A:
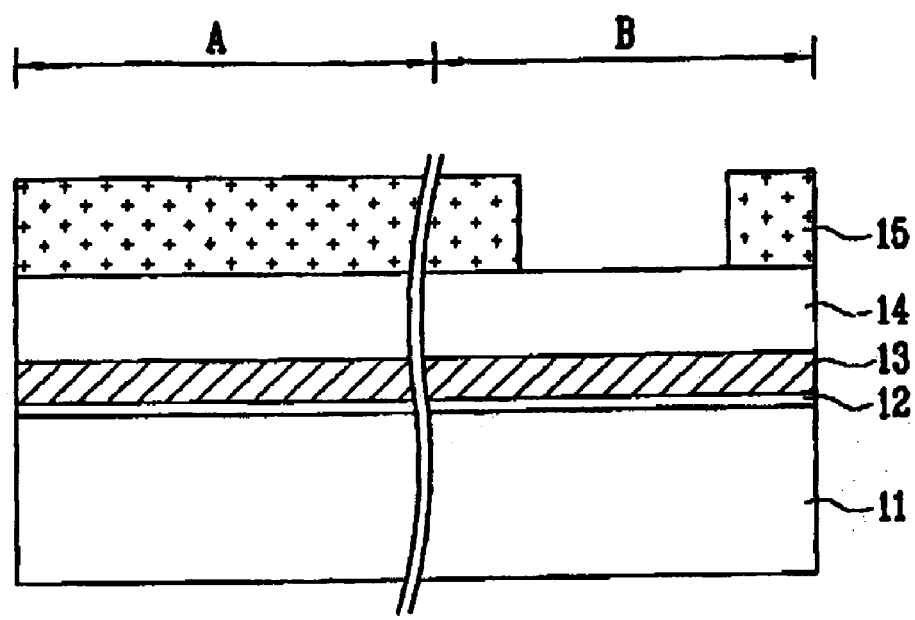
FIGS. 1A to 1F are sectional views sequentially showing process steps for embodying a disclosed method of fabricating a flash memory device.

Referring to FIG. 1A, a tunnel oxide film 12, a polysilicon film 13 and a hard mask film 14 are sequentially formed on a semiconductor substrate 11 in which a region A where the pattern density is higher and a region B where the pattern density is lower are defined. A first photoresist film 15 is then formed. In this time, the region A where the pattern density is higher is a cell region where the gate size is small and the region B where the pattern density is lower is a peripheral circuit region where the gate size is larger. Next, the first photoresist film 15 in the region B where the pattern density is lower is patterned.

Figure 1B:
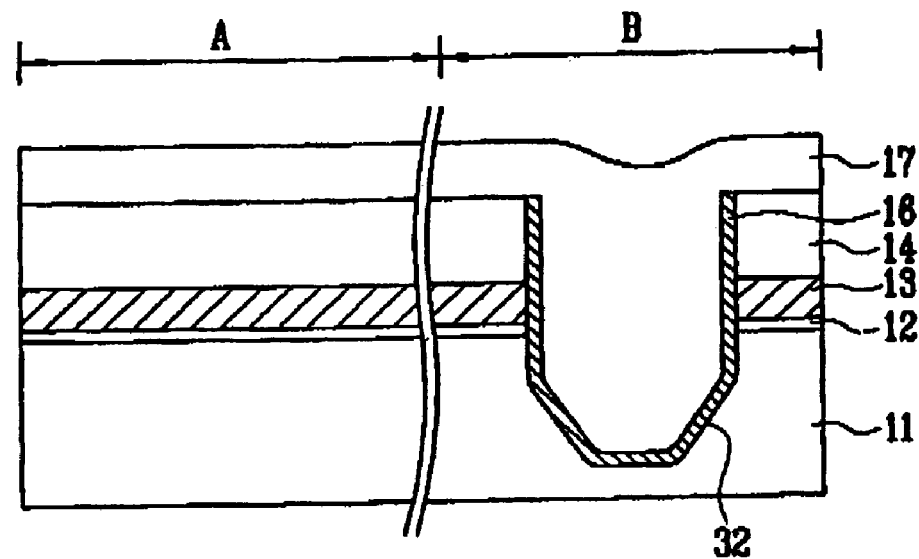

Referring to FIG. 1B, the hard mask film 14, the polysilicon film 13 and the tunnel oxide film 12 are etched using the patterned first photoresist film 15 in the region B as a mask where the pattern density is low, thus exposing the semiconductor substrate 11. The semiconductor substrate 11 is then etched to a given depth by an etch process, thus forming a first trench 32. After the first photoresist film 15 is removed, a first wall oxide film 16 is formed on the first trench 32 by means of an oxidization process and a liner oxide film (not shown) is then formed.

In this time, the first wall oxide film 16 is formed to a thickness of 30 to 60 Å by means of a dry oxidization process at a temperature ranging from 750 to 850° C. Thereafter, a first insulating film 17, for example, a HDP oxide film is formed so that the first trench 32 is buried or filled. In this time, a smiling effect of the tunnel oxide film 12 is not generated in the region B where the pattern density is low even by the wall oxidization process. Accordingly, the thickness of the tunnel oxide film 12 is not increased. Meanwhile, when the first insulating film 17 is formed so that the first trench 32 in the region B where the pattern density is low is buried, the first insulating film 17 is formed to a give thickness on the hard mask film 14 in the region A where the pattern density is high.

Figure 1C:
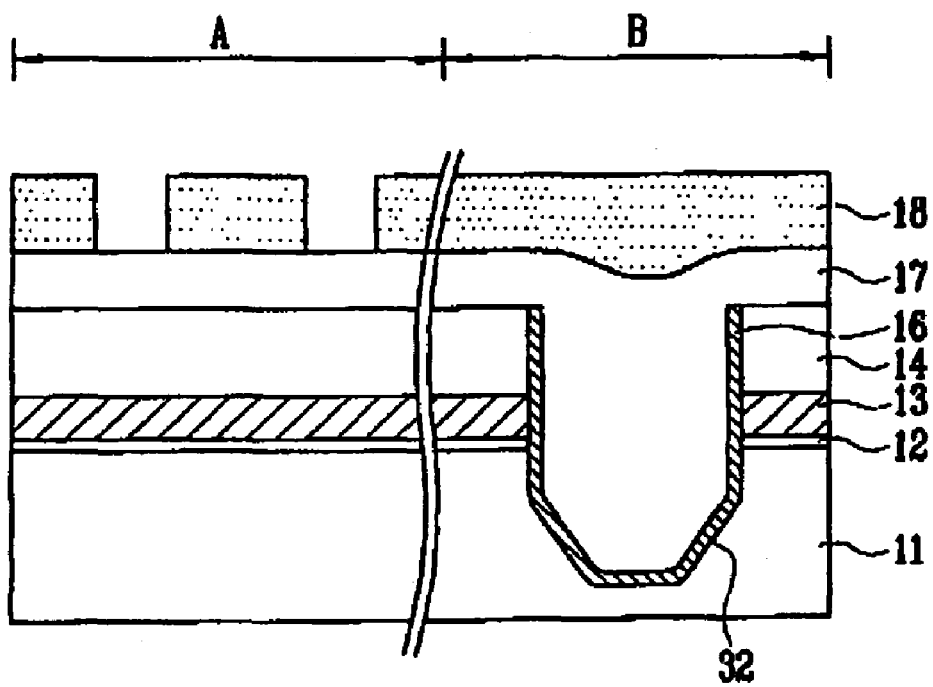

Referring to FIG. 1C, after a second photoresist film 18 is formed on the entire surface, the second photoresist film 18 in the region A where the pattern density is high and where the gate size is small is patterned.

Figure 1D:
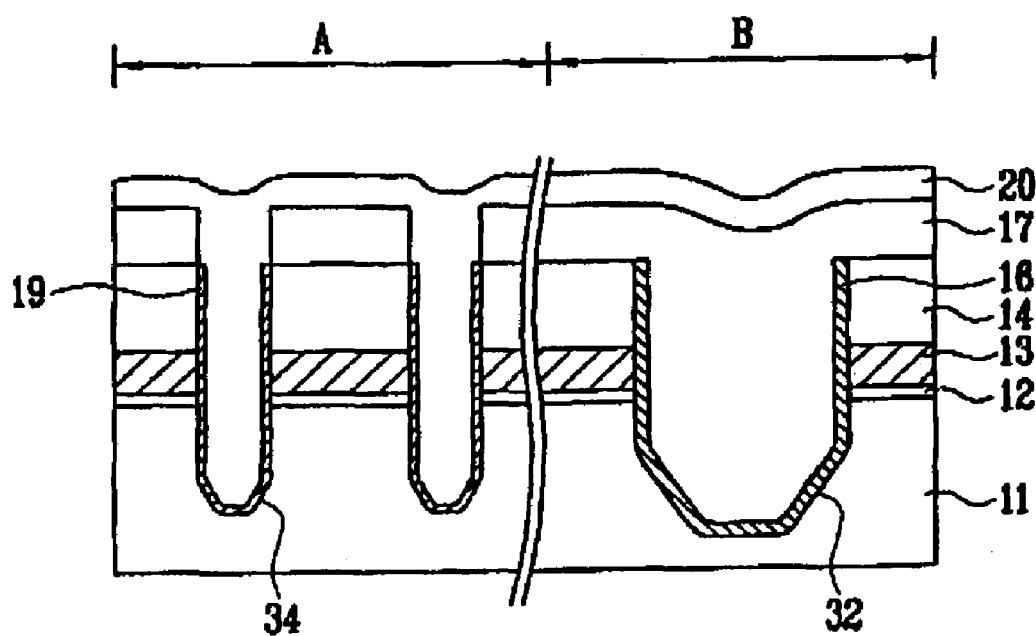

Referring to FIG. 1D, the first insulating film 17, the hard mask film 14, the polysilicon film 13 and the tunnel oxide film 12 in the region A where the pattern density is high are etched using the patterned second photoresist film 18 as a mask, thereby exposing the semiconductor substrate 11. The semiconductor substrate 11 is then etched to a given depth by an etch process, thus forming a second trench 34. After the second photoresist film 18 is removed, a second wall oxide film 19 is formed on the second trench 34 in the region A where the pattern density is high by means of an oxidization process, and a liner oxide film (not shown) is then formed. At this time, it is preferred that the second wall oxide film 19 formed on the second trench 34 in the region A where the pattern density is high have a thickness that is less or thinner than that of the first wall oxide film 16 formed on the first trench 32 in the region B where the pattern density is low. For example, the second wall oxide film 19 is formed 10 to 30 Å in thickness by means of a dry oxidization process at a temperature ranging from 750 to 850° C. Furthermore, a second insulating film 20, for example, a HDP oxide film is formed so that the second trench 34 is buried.

Figure 1E:
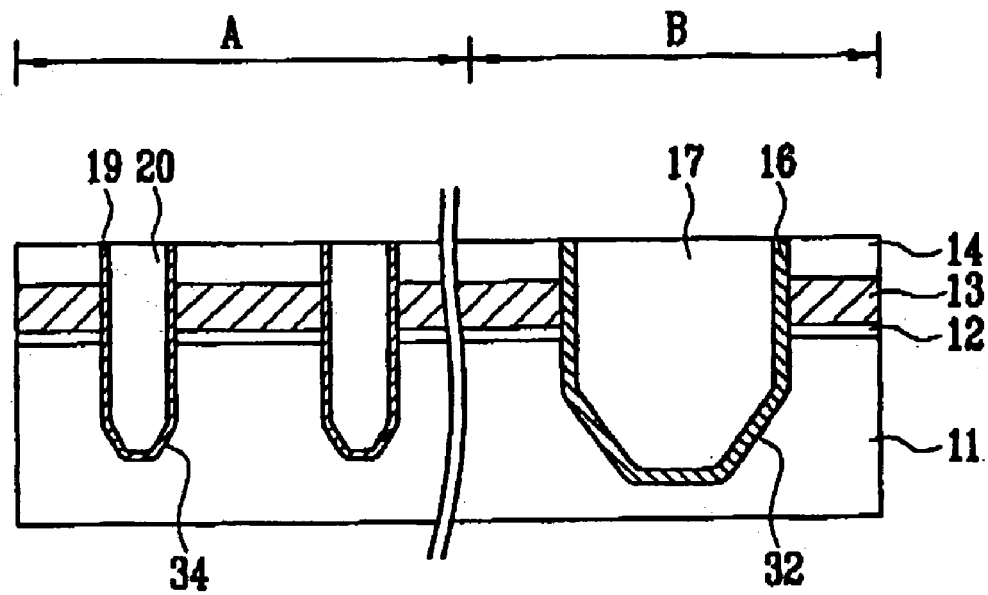

Referring to FIG. 1E, the first insulating film 17 and the second insulating film 20 are polished using CMP and the hard mask film 14 is then removed by a wet etch process using a $H_3PO_4$ solution.

Figure 1F:
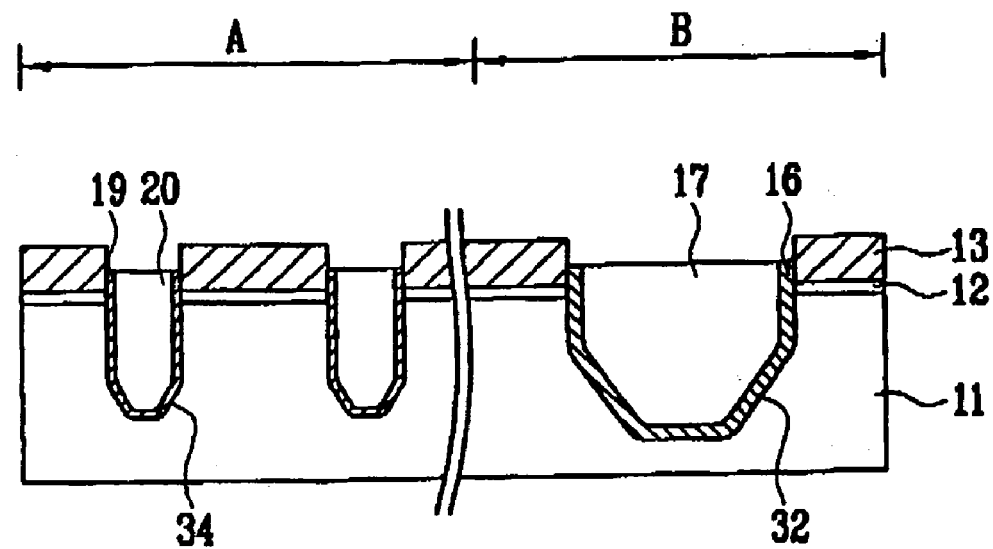

Referring to FIG. 1F, the first and second insulating film 17 and 20 are etched to a thickness where the tunnel oxide film 12 is not exposed, thus forming an isolation film.

As described above, a trench formation process and a wall oxide film formation process are performed separately depending on the pattern density, and wall oxide films in the respective trenches are formed with different thicknesses. The thickness of the wall oxide film is less in the high density, thin trench area and the thickness of the wall oxide film greater in the low density, under trench area. Accordingly, an increase in a thickness of the wall oxide films due to a smiling phenomenon of a tunnel oxide film by a wall oxidization process can be prevented and reliability of a device can be improved.

Although the foregoing description has been made with reference to the preferred embodiments, it is to be understood that changes and modifications may be made by one of ordinary skill in the art without departing from the spirit and scope of the appended claims.

What is claimed is:

1. A method of fabricating a flash memory device, comprising the steps of:
   sequentially forming a tunnel oxide film, a polysilicon film and a hard mask film on a semiconductor substrate in which a first region where the gate size is small and a second region where the gate size is great are defined;
   etching a predetermined region of the hard mask film, the polysilicon film and the tunnel oxide film in the second region, and then etching the semiconductor substrate at a given depth to form a first trench;
   forming a first wall oxide film on the first trench;
   forming a first insulating film on the entire surface so that the first trench is buried;
   etching a predetermined region of the hard mask film, the polysilicon film and the tunnel oxide film in the first region, and then etching the semiconductor substrate at a given depth to form a second trench;
   forming a second wall oxide film on the first trench;
   forming a second insulating film on the entire surface so that the second trench is buried; and
   polishing the first and second insulating films and then removing the hard mask film.

2. The method as claimed in claim 1, comprising forming the first wall oxide film to be thicker than the second wall oxide film.

3. The method as claimed in claim 1, comprising forming the first wall oxide film 30 Å to 60 Å in thickness, and forming the second wall oxide film 10 Å to 30 Å in thickness.

4. The method as claimed in claim 1, comprising forming the first and second wall oxide films by a dry oxidization process at a temperature ranging from 750° C. to 850° C.

5. The method as claimed in claim 1, wherein the first and second insulating film include a HDP oxide film.

6. A method of fabricating a flash memory device in which a plurality of trenches are formed on a semiconductor substrate, a plurality of wall oxide films are formed on the trenches, and the trenches are buried with an insulating film, comprising forming the trenches by a different process depending on the pattern density, and forming the wall oxide films to be thicker in a region where the pattern density is coarse than in a region where the pattern density is dense.

* * * * *